US011532684B2

(12) United States Patent
Wang et al.

(10) Patent No.: US 11,532,684 B2
(45) Date of Patent: Dec. 20, 2022

(54) DISPLAY MOTHERBOARD, DISPLAY PANEL, AND FABRICATING METHOD OF DISPLAY PANEL

(71) Applicant: EverDisplay Optronics (Shanghai) Co., Ltd., Shanghai (CN)

(72) Inventors: Huannan Wang, Shanghai (CN); Gang Liu, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 0 days.

(21) Appl. No.: 16/644,872

(22) PCT Filed: Jan. 10, 2019

(86) PCT No.: PCT/CN2019/071237
§ 371 (c)(1),
(2) Date: Mar. 5, 2020

(87) PCT Pub. No.: WO2020/048078
PCT Pub. Date: Mar. 12, 2020

(65) Prior Publication Data
US 2021/0225979 A1    Jul. 22, 2021

(30) Foreign Application Priority Data
Sep. 6, 2018 (CN) .................... 201811036952.3

(51) Int. Cl.
*H01L 27/32* (2006.01)
*G09G 3/3225* (2016.01)
(52) U.S. Cl.
CPC ....... *H01L 27/3265* (2013.01); *G09G 3/3225* (2013.01); *G09G 2300/026* (2013.01);
(Continued)

(58) Field of Classification Search
CPC .......... G09G 3/3225; G09G 2300/026; G09G 2300/0842; G09G 2320/0233
See application file for complete search history.

(56) References Cited

U.S. PATENT DOCUMENTS

| 9,217,902 B1 | 12/2015 | Zheng |
| 2001/0054734 A1 | 12/2001 | Koh |

(Continued)

FOREIGN PATENT DOCUMENTS

| CN | 1916709 A | 2/2007 |
| CN | 105096785 A | 11/2015 |

(Continued)

OTHER PUBLICATIONS

The ISR dated Apr. 29, 2019 by the WIPO.
The 1st Office Action dated Sep. 3, 2020 by the CNIPA.

*Primary Examiner* — Shaheda A Abdin
(74) *Attorney, Agent, or Firm* — Qinghong Xu

(57) ABSTRACT

The present disclosure provides a display motherboard, a display panel, and a method for fabricating a display panel, wherein the display motherboard includes a plurality of rows of display units, and a first side edge of the display panel is provided with a first row of display units and a second side edge of the display panel is provided with a second row of display units; an electrode overlap area of a storage capacitor of the first row of display units is gradually increased from a second side to a first side of the first row of display units; an electrode overlap area of a storage capacitor of the second row of display units is gradually increased from a first side to a second side of the second row of display units. The present disclosure performs gradual compensation for the storage capacitor with respect to uniform luminance at a low gray scale caused by unevenness in a manufacturing procedure and adjusts a size of the storage capacitor according to a variation amount in the manufacturing procedure, to (Continued)

and ensure that current flowing through each light emitting diode in the display panel is substantively the same, thus improving luminance uniformity of the display panel at a low gray scale.

11 Claims, 7 Drawing Sheets

(52) U.S. Cl.
CPC ............ *G09G 2300/0842* (2013.01); *G09G 2320/0233* (2013.01)

(56) References Cited

U.S. PATENT DOCUMENTS

| | | | | |
|---|---|---|---|---|
| 2007/0146248 | A1* | 6/2007 | Guo | G09G 3/325 345/76 |
| 2008/0106541 | A1* | 5/2008 | Yamazaki | G09G 3/3614 345/212 |
| 2009/0073079 | A1* | 3/2009 | Miller | H01L 27/3293 345/1.3 |

FOREIGN PATENT DOCUMENTS

| | | |
|---|---|---|
| CN | 106684102 A | 5/2017 |
| CN | 107589607 A | 1/2018 |
| CN | 107646137 A | 1/2018 |
| CN | 107994060 A | 5/2018 |
| JP | H05232509 A | 9/1993 |

\* cited by examiner

DISPLAY MOTHERBOARD, DISPLAY PANEL, AND FABRICATING METHOD OF DISPLAY PANEL

CROSS-REFERENCE TO RELATED APPLICATIONS

The present application is based upon International Application No. PCT/CN2019/071237, filed on Jan. 10, 2019, which is based upon and claims priority of Chinese patent application No. 201811036952.3, filed on Sep. 6, 2018, the contents of which are hereby incorporated by reference in its entirety.

TECHNICAL FIELD

The present disclosure relates to the field of display technologies, and more particularly, to a display motherboard, a display panel, and a method for fabricating a display panel.

BACKGROUND

An active-matrix organic light emitting diode (AMO-LED) is a current driving device, and the organic light emitting diode emits light when a driving current flows through it. The driving current is generally supplied by an AMOLED pixel driving circuit, which generally includes at least a driving Thin Film Transistor (TFT), a switching TFT, and a storage capacitor. When the switching TFT is turned on, a data signal is transmitted to a gate electrode of the driving TFT and is stored in the storage capacitor, and then the driving generates a driving current to force the organic light emitting diode to emit light.

SUMMARY

The present disclosure provides a display motherboard, a display panel, and a method for fabricating a display panel.

According to an aspect of the present disclosure, there is provided a display motherboard, including a plurality of rows of display units, wherein each of the display units includes a plurality of light emitting elements and pixel driving circuits in one-to-one correspondence with the light emitting elements, each of the pixel driving circuits includes a storage capacitor, and each of the display units includes a first side and a second side opposite to each other, and the second side of the display unit is an IC bonding side;

wherein the display motherboard includes a first side edge and a second side edge opposite to each other, a first row of display units is disposed at the first side edge of the display motherboard, and a second row of display units is disposed at the second side edge of the display motherboard;

an electrode overlap area of a storage capacitor of the first row of display units is gradually increased from a second side to a first side of the first row of display units; and an electrode overlap area of a storage capacitor of the second row of display units is gradually increased from a first side to a second side of the second row of display units.

Optionally, the display motherboard includes a first half-plate and a second half-plate, a size of the first half-plate and a size of the second half-plate correspond to a size of an evaporation device, respectively;

the first half-plate includes a first side edge and a second side edge opposite to each other, wherein the first row of display units is disposed at the first side edge of the first half-plate, and a third row of display units is disposed at the second side edge of the first half-plate;

the second half-plate includes a first side edge and a second side edge opposite to each other, wherein a fourth row of display units is disposed at the first side edge of the second half-plate, and the second row of display units is disposed at the second side edge of the second half-plate;

a second side of the third row of display units corresponds to the second side edge of the first half-plate, and an electrode overlap area of a storage capacitor of the third row of display units is gradually increased from a first side to the second side of the third row of display units; and a first side of the fourth row of display units corresponds to the first side edge of the second half-plate, and an electrode overlap area of a storage capacitor of the fourth row of display units is gradually increased from a second side to the first side of the fourth row of display units.

Optionally, the first half-plate further includes a fifth row of display units between the first row of display units and the third row of display units; and the second half-plate further includes a sixth row of display units between the second row of display units and the fourth row of display units;

an electrode overlap area of each storage capacitor of the fifth row of display units is identical; and an electrode overlap area of each storage capacitor of the sixth row of display units is identical.

Optionally, an electrode overlap area of a storage capacitor on the first side of the first row of display units is 1%~10% larger than an electrode overlap area of a storage capacitor on the second side of the first row of display units; and an electrode overlap area of a storage capacitor on the second side of the second row of display units is 1%~10% larger than an electrode overlap area of a storage capacitor on the first side of the second row of display units.

Optionally, an electrode overlap area of a storage capacitor on the second side of the third row of display units is 1%~10% larger than an electrode overlap area of a storage capacitor on the first side of the third row of display units; and an electrode overlap area of a storage capacitor on the first side of the fourth row of display units is 1%~10% larger than an electrode overlap area of a storage capacitor on the second side of the fourth row of display units.

An embodiment of the present disclosure further provides a display panel including one of the display units.

An embodiment of the present disclosure further provides a method for fabricating a display panel, including steps of:

S100: providing a substrate;

S200: forming a plurality of rows of display units on the substrate to obtain a display motherboard, wherein each of the display units comprises a plurality of rows of display units, each of the display units includes a plurality of light emitting elements and pixel driving circuits in one-to-one correspondence with the light emitting elements, each of the pixel driving circuits includes a storage capacitor, and each of the display units includes a first side and a second side opposite to each other, and the second side of the display unit is an IC bonding side;

the display motherboard includes a first side edge and a second side edge opposite to each other, wherein a first row of display units is disposed at the first side edge of the display motherboard, and a second row of display units is disposed at the second side edge of the display motherboard;

a first side of the first row of display units corresponds to the first side edge of the display motherboard, and an electrode overlap area of a storage capacitor on the first side of the first row of display units is larger than an electrode overlap area of a storage capacitor on a second side of the first row of display units;

a second side of the second row of display units corresponds to the second side edge of the display motherboard, and an electrode overlap area of a storage capacitor on the second side of the second row of display units is larger than an electrode overlap area of a storage capacitor on a first side of the second row of display units;

S300: cutting the display motherboard to acquire a plurality of display panels, each of which includes one of the display units.

Optionally, the electrode overlap area of the storage capacitor of the first row of display units is gradually increased from the second side to the first side of the first row of display units; and the electrode overlap area of the storage capacitor of the second row of display units is gradually increased from the first side to the second side of the second row of display units.

Optionally, the step S200, in which a plurality of rows of display units is formed on the substrate to obtain a display motherboard, includes steps of:

S201: forming a plurality of rows of driving arrays on the substrate, wherein each of the driving arrays includes a plurality of pixel driving circuits, each of which includes a storage capacitor;

S202: cutting the substrate to acquire a first half-plate and a second half-plate;

S203: forming a plurality of light emitting elements by performing evaporation over each of the driving arrays of the first half-plate, wherein each of the driving arrays and its corresponding light emitting element form a display unit;

S204: forming a plurality of light emitting elements by performing evaporation over each of the driving arrays of the second half plate, wherein each of the driving arrays and its corresponding light emitting element form a display unit;

the first half-plate includes a first row of display units disposed at the first side edge and a third row of display units disposed at the second side edge, wherein a second side of the third row of display units corresponds to the second side edge of the first half-plate, and an electrode overlap area of a storage capacitor of the third row of display units is gradually increased from a first side to the second side of the third row of display units;

the second half-plate includes a fourth row of display units disposed at the first side edge and a second row of display units disposed at the second side edge, wherein a first side of the fourth row of display units corresponds to the first side edge of the second half-plate; and an electrode overlap area of a storage capacitor of the fourth row of display units is gradually increased from a second side to the first side of the fourth row of display units.

Optionally, the first half-plate further includes a fifth row of display units between the first row of display units and the third row of display units; and the second half-plate further includes a sixth row of display units between the second row of display units and the fourth row of display units;

an electrode overlap area of each storage capacitor of the fifth row of display units is identical; and an electrode overlap area of each storage capacitor of the sixth row of display units is identical.

BRIEF DESCRIPTION OF THE DRAWINGS

In order to more clearly describe technical solutions in embodiments of the present disclosure or in the prior art, drawings used for the description of the embodiments or existing technologies will be briefly introduced below. Obviously, the drawings in the following descriptions are only some embodiments of the present disclosure, and those skilled in the art can also obtain other drawings based on these drawings without any creative work.

DETAILED DESCRIPTION

Figure 1:
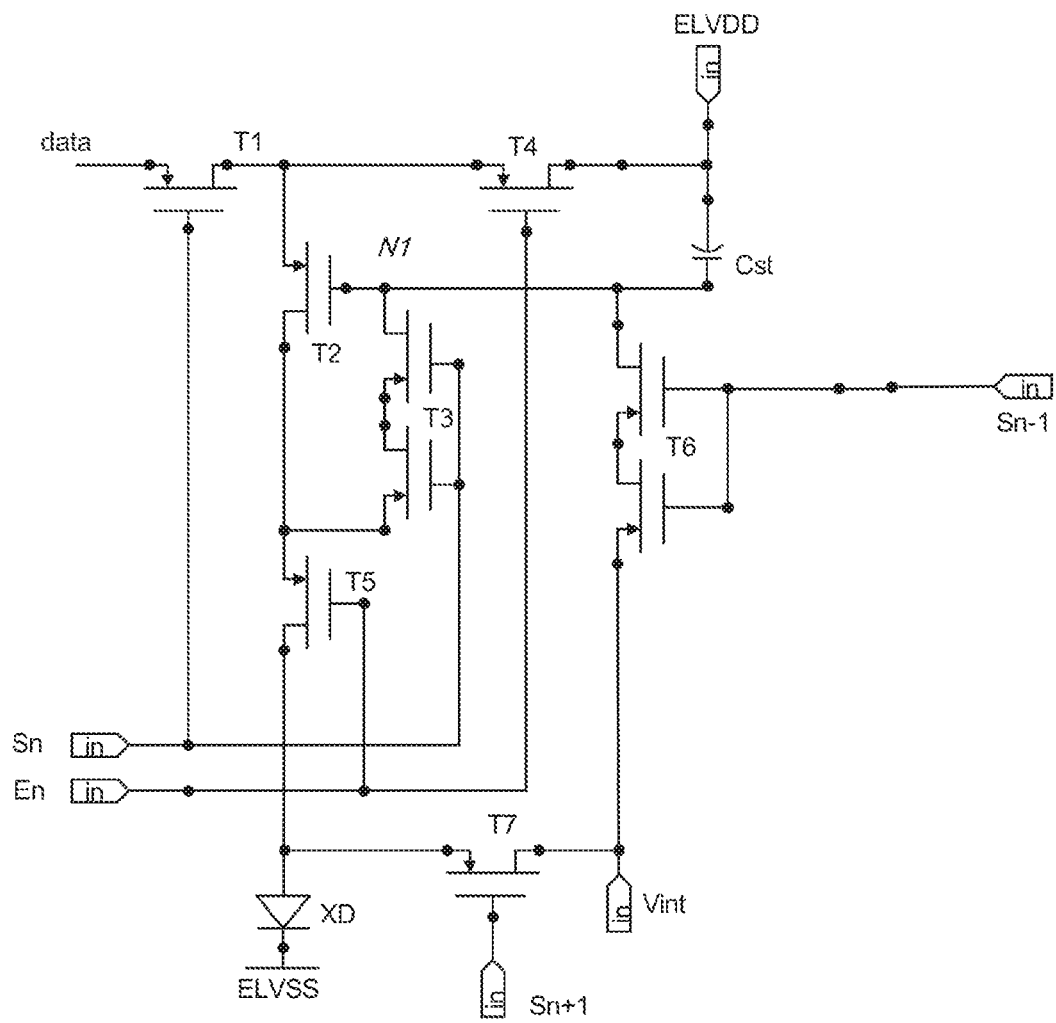
FIG. 1 is a schematic diagram of a pixel driving circuit.

The exemplary implementations will now be described more fully with reference to the accompanying drawings. However, the exemplary implementations may be implemented in various forms and should not be understood as being limited to the implementations set forth herein; rather, these implementations are provided so that this disclosure will be thorough and complete, and will fully convey the conception of exemplary implementations to those skilled in the art. In the drawings, the same reference numerals denote the same or similar structures, thus their detailed description will be omitted.

The features, structures or characteristics described herein can be combined in one or more embodiments in any appropriate way. In the description hereinafter, many specific details are provided for fully understanding of the embodiments of the present disclosure. However, it will be appreciated by those skilled in the art that the technical solution of the present disclosure can also be practiced without one or more of the specific details, or with other methods, components, or materials, etc. in some cases, known structures, materials or operations will not be illustrated or described in detail, to avoid obscuration of the present disclosure.

To solve the technical problem that luminance uniformity of a display panel is poor currently, the present disclosure carries out gradual compensation for the storage capacitor to deal with unevenness in a manufacturing procedure, and adjusts a size of the storage capacitor according to a variation amount in the manufacturing procedure. If an IC bonding side is relatively bright at a low gray level, a design value of the storage capacitor away from the IC bonding side is relatively great when the storage capacitor is designed; and if the IC bonding side is relatively dark at a low gray level, a design value of the storage capacitor close to the IC bonding side is relatively great when the storage capacitor is designed.

The size of the capacitor is: $C=\varepsilon S/4\pi kd$, where $\varepsilon$ is a constant, S is an overlap area of upper and lower electrodes of the capacitor, and d is a distance between capacitor plates, which mainly depends on a thickness of an insulation film, and k is an electrostatic force constant. Since the thickness of the insulation film is often constant during a production process and the insulation film may be uneven during a manufacturing process, in the present disclosure, the size of the storage capacitor is changed mainly by adjusting an overlap area of the upper and lower electrodes of the storage capacitor. The overlap area of the upper and lower electrodes refers to an area of an overlapping portion of an orthographic projection of the upper electrode plate of the capacitor on a reference plane parallel to the lower electrode plate.

FIG. 1 shows a circuit diagram of a pixel driving circuit. The pixel driving circuit consists of seven transistors T1~T7. A data signal data is inputted to an end of the transistor T1. A gate electrode of the transistor T1 and a gate electrode of the transistor T3 are both controlled by a first scanning signal Sn. A gate electrode of the transistor T5 and a gate electrode of the transistor T4 are both controlled by an enable signal En. A gate electrode of the transistor T6 is controlled by a second scanning signal Sn−1. A gate electrode of the transistor T7 is controlled by a third scanning signal Sn+1. An end of a light emitting diode XD is connected to a power supply negative signal ELVSS, and the other end of the light emitting diode XD is connected to the transistor T5. A power supply positive signal ELVDD is inputted to an end of the transistor T4. A storage capacitor Cst is connected between the power supply positive signal ELVDD and a first node N1.

Figure 2:
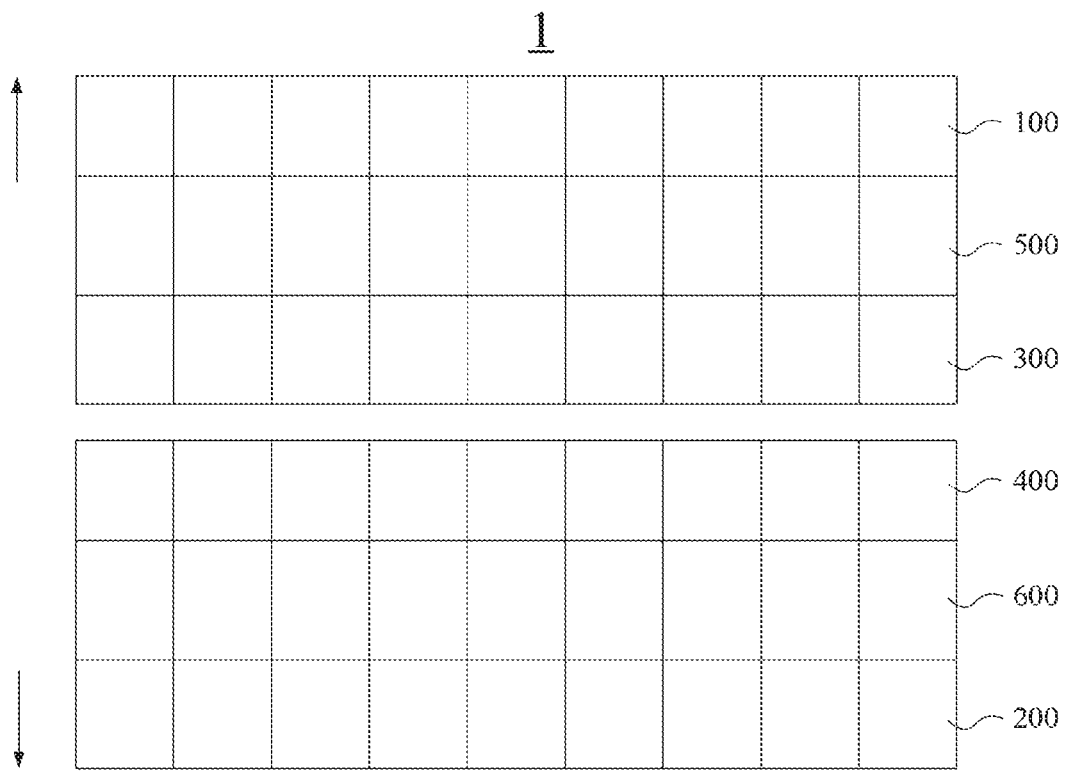
FIG. 2 is a structural schematic diagram of a display motherboard according to an embodiment of the present disclosure.

As shown in FIG. 2, the present disclosure provides a display motherboard 1 which includes a plurality of rows of display units each including a plurality of light emitting elements and pixel driving circuits which are in one-to-one correspondence with the light emitting elements. Each of the pixel driving circuits includes a storage capacitor. Each of the display units includes a first side and a second side which are opposite to each other, and the second side of the display unit is an IC bonding side. In FIG. 2, the first side of each of the display units is an upper side, and the second side is a lower side.

The display motherboard includes a first side edge and a second side edge which are opposite to each other, and the first side edge and the second side edge are an upper edge and a lower edge in FIG. 2, respectively. A first row of display units 100 is disposed at the first side edge of the display motherboard, and a second row of display units 200 is disposed at the second side edge of the display motherboard.

When an insulation film of the storage capacitor Cst is deposited on a substrate of the display motherboard 1, a thickness of the deposited insulation film may be ununiform due to instability of a deposition device and deposition environment. In particular, a structure of each of the display units in the display motherboard 1 is as follows.

The first row of display units 100 located at the upper edge of the display motherboard 1 has a first side which corresponds to the first side edge of the display motherboard 1, and the thickness of the insulation film of the first row of display units 100 close to the upper edge of the motherboard is relatively thick. That is, the thickness of the insulation film on the first side of the first row of display units 100 is thicker than that on a second side thereof. To compensate for the thickness difference of the insulation film, an electrode overlap area of the storage capacitor Cst is adjusted accordingly, so that the electrode overlap area of the storage capacitor Cst on the first side of the first row of display units 100 is larger than the electrode overlap area of the storage capacitor Cst on the second side thereof.

The second row of display units 200 located at the lower edge of the display motherboard 1 has a second side which corresponds to the second side edge of the display motherboard 1, and the thickness of the insulation film of the second row of display units 200 close to the lower edge of the motherboard is relatively thick. That is, the thickness of the insulation film on the second side of the second row of display units 200 is thicker than that on a first side thereof. To compensate for the thickness difference of the insulation film, an electrode overlap area of the storage capacitor Cst is adjusted accordingly, so that the electrode overlap area of the storage capacitor Cst on the second side of the second row of display units 200 is larger than the electrode overlap area of the storage capacitor Cst on the first side thereof.

In this embodiment, the electrode overlap area of the storage capacitor of the first row of display units is gradually increased from the second side to the first side of the first row of display units 100; and the electrode overlap area of the storage capacitor of the second row of display units is gradually increased from the first side to the second side of the second row of display units 200, that is, the storage capacitor is progressively compensated.

Figure 3:
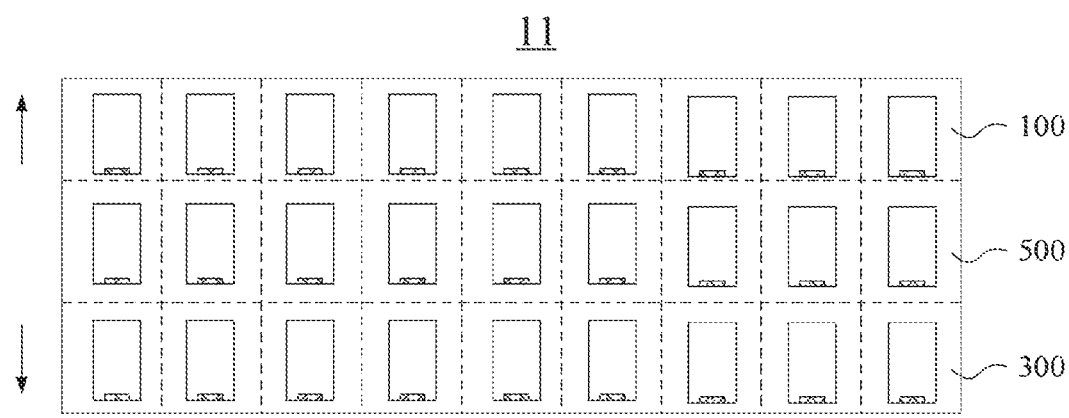
FIG. 3 is a structural schematic diagram of a first half-plate according to an embodiment of the present disclosure.
Figure 4:
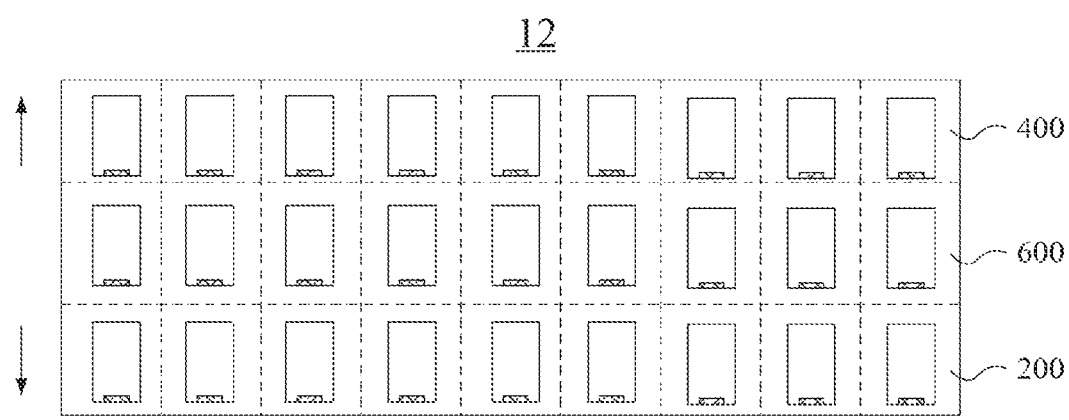
FIG. 4 is a structural schematic diagram of a second half-plate according to an embodiment of the present disclosure.

As shown in FIGS. 3 and 4, in this embodiment, the display motherboard 1 further includes a first half-plate 11 and a second half-plate 12. A size of the first half-plate 11 and a size of the second half-plate 12 correspond to a size of an evaporation device, respectively. When a light emitting device is formed by performing evaporation on the display motherboard 1, if the display motherboard 1 has a relatively large area, the display motherboard 1 may be first cut in the middle to obtain the first half-plate 11 and the second half-plate 12, and then the first half-plate 11 and the second half-plate 12 are evaporated, respectively.

As shown in FIG. 3, the first half-plate 11 includes a first side edge and a second side edge which are opposite to each other, and the first side edge and the second side edge are upper and lower edges in FIG. 3, respectively. A first row of display units 100 is disposed at the first side edge of the first half-plate 11, and a third row of display units 300 is disposed at the second side edge of the first half-plate 11.

As shown in FIG. 4, the second half-plate 12 includes a first side edge and a second side edge which are opposite to each other, and the first side edge and the second side edge are upper and lower edges in FIG. 4, respectively. A fourth row of display units 400 is disposed at the first side edge of the second half-plate 12, and a second row of display units 200 is disposed at the second side edge of the second half-plate.

During an evaporation process, the thickness of an OLED light emitting layer obtained by evaporation may also be non-uniform due to the uncertainty of the evaporation device and the evaporation environment, which then will cause luminance non-uniformity. In particular, in each of the half-plates, the display units at the upper and lower edges will be greatly affected.

Therefore, in this embodiment, storage capacitors of the third row of display units 300 and the fourth row of display units 400 are further compensated. A second side of the third row of display units 300 corresponds to the second side edge of the first half-plate 11. An electrode overlap area of the storage capacitor on the second side of the third row of display units 300 is larger than an electrode overlap area of the storage capacitor on a first side thereof. Further, the electrode overlap area of the storage capacitor of the third row of display units 300 is gradually increased from the first side to the second side of the third row of display units 300. A first side of the fourth row of display units 400 corresponds to the first side edge of the second half-plate 12. An electrode overlap area of the storage capacitor on the first side of the fourth row of display units 400 is larger than an electrode overlap area of the storage capacitor on a second side thereof. Further, the electrode overlap area of the storage capacitor of the fourth row of display units 400 is gradually increased from the second side to the first side of the fourth row of display units 400.

As shown in FIGS. 3 and 4, in this embodiment, the first half-plate 11 further includes a fifth row of display units 500 located between the first row of display units 100 and the third row of display units 300. The second half-plate 12 further includes a sixth row of display units 600 between the second row of display units 200 and the fourth row of display units 400. Since the fifth row of display units 500 and the sixth row of display units 600 are less affected by the thickness of the insulation film and the thickness of the evaporated film, storage capacitors of these two rows of display units may not be compensated. That is, in this embodiment, each storage capacitor of the fifth row of display units has an identical electrode overlap area, and each storage capacitor of the sixth row of display units has an identical electrode overlap area.

The present disclosure, however, is not limited thereto. In this embodiment, only one row of the fifth row of display units 500 and one row of the sixth row of display units 600 are shown. However, for a larger display motherboard, there may be more than one row of the fifth row of display units 500 between the first row of display units 100 and the third row of displays the units 300, and also there may be more than one row of the sixth row of display units 600 between the second row of display units 200 and the fourth row of display units 400. When there are many rows of the fifth row of display units 500 and the sixth row of display units 600, the display units close to the edges of the half-plates or the edges of the motherboard may also be significantly affected by the thickness of the insulation film or the thickness of the evaporated film, and the storage capacitor may also be compensated in the above manner, all of which fall within the protection scope of the present disclosure.

In this embodiment, the electrode overlap area of the storage capacitor on the first side of the first row of display units 100 is 1%~10% larger than the electrode overlap area of the storage capacitor on the second side of the first row of display units 100; and the electrode overlap area of the storage capacitor on the second side of the second row of display units 200 is 1%~10% larger the electrode overlap area of the storage capacitor on the first side of the second row of display units 200.

Further, for a relatively small display unit, a difference of electrode overlap areas of storage capacitors on both sides may range from about 1% to about 5%; and for a relatively large display unit, a difference of electrode overlap areas of storage capacitors on both sides may range from about 5% to about 10%. However, the present disclosure is not limited thereto, and it may also employ other numerical ranges, all of which fall within the protection scope of the present disclosure.

Similarly, in this embodiment, the electrode overlap area of the storage capacitor on the second side of the third row of display units 300 is 1%~10% larger than the electrode overlap area of the storage capacitor on the first side of the third row of display units 300; and the electrode overlap area of the storage capacitor on the first side of the fourth row of display units 400 is 1%~10% larger than the electrode overlap area of the storage capacitor on the second side of the fourth row of display units 400. Further, for a relatively small display unit, a difference of electrode overlap areas of storage capacitors on both sides may range from about 1% to about 5%; and for a relatively large display unit, a difference of electrode overlap areas of storage capacitors on both sides may range from about 5% to about 10%. How-ever, the present disclosure is not limited thereto, and it may also employ other numerical ranges, all of which fall within the scope of the present disclosure.

There may be various implementation manners to change an electrode oppositing area of a storage capacitor, some of which will be listed below, but it shall be understood that the present disclosure is not limited thereto.

(1) If a first electrode and a second electrode of the storage capacitor are formed of a semiconductor layer and a first gate electrode metal layer, respectively, the electrode opposing area of the storage capacitor may be changed by:

(1.1) changing a line width or a shape of the semiconductor layer, or simultaneously changing both the line width and shape of the semiconductor layer;

(1.2) changing a line width or a shape of the first gate electrode metal layer, or simultaneously changing both the line width and shape of the first gate electrode metal layer;

(1.3) simultaneously changing the line width and/or shape of the semiconductor layer and the first gate electrode metal layer.

(2) If the first electrode and the second electrode of the storage capacitor are formed of a semiconductor layer and a second gate electrode metal layer, respectively, the electrode oppositing area of the storage capacitor may be changed by:

(2.1) changing a line width or a shape of the semiconductor layer, or simultaneously changing both the line width and shape of the semiconductor layer;

(2.2) changing a line width of the second gate electrode metal layer or a shape of the second gate electrode metal layer, or simultaneously changing both the line width and shape of the second gate electrode metal layer;

(2.3) simultaneously changing the line width and/or shape of the semiconductor layer and the second gate electrode metal layer.

(3) if the first electrode and the second electrode of the storage capacitor are formed of a first gate electrode metal layer and a second gate electrode metal layer, respectively, the electrode oppositing area of the storage capacitor may be changed by:

(3.1) changing a line width or a shape of the first gate electrode metal layer, or simultaneously changing both the line width and shape of the first gate electrode metal layer;

(3.2) changing a line width of the second gate electrode metal layer or a shape of the second gate electrode metal layer, or simultaneously changing both the line width and shape of the second gate electrode metal layer;

(3.3) simultaneously changing the line width and/or shape of the first gate electrode metal layer and the second gate electrode metal layer.

(4) If the storage capacitor is formed by a semiconductor layer, a first insulation layer, a first gate electrode metal layer, a second insulation layer, and a second gate electrode metal layer, the electrode oppositing area of the storage capacitor may be changed by:

(4.1) changing a line width or a shape of the semiconductor layer, or simultaneously changing both the line width and shape of the semiconductor layer;

(4.2) changing a line width or a shape of the first gate electrode metal layer, or simultaneously changing both the line width and shape of the first gate electrode metal layer;

(4.3) a line width of the second gate electrode metal layer or the shape of the second gate electrode metal layer; or simultaneously changing the line width and shape of the second gate electrode metal layer;

(4.4) simultaneously changing the line width and/or shape of the semiconductor layer and the first gate electrode metal layer;

(4.5) simultaneously changing the line width and/or shape of the semiconductor layer and the second gate electrode metal layer;

(4.6) simultaneously changing the line width and/or shape of the first gate electrode metal layer and the second gate electrode metal layer;

(4.7) simultaneously changing the line width and/or shape of the semiconductor layer, the first gate electrode metal layer, and the second gate electrode metal layer.

An embodiment of the present disclosure further provides a display panel including one display unit cut from a display motherboard. The display panel may include one display unit 110 in the first row of display units 100, or one display unit 200 in the second row of display units 200, one display unit in a third row of display units 300, one display unit in a fourth row of display units 400, one display unit in a fifth row of display units 500, or one display unit in a sixth row of display units 600.

Figure 5:
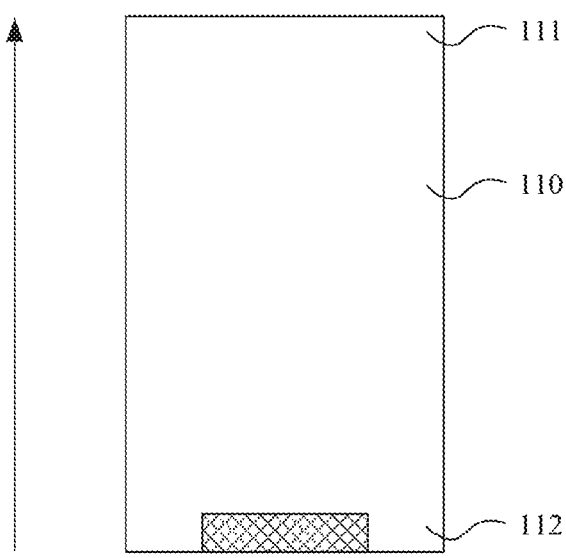
FIGS. 5 and 6 are structural schematic diagrams of a display panel according to an embodiment of the present disclosure.

FIG. 5 shows a display panel which includes one display unit 110 in the first row of display units 100, The display unit 110 includes a first side 111 and a second side 112 which are opposite to each other, the second side 112 is an IC bonding side. An electrode overlap area of a storage capacitor Cst is gradually increased from the second side 112 to the first side 111 of the display unit 110 to compensate for luminance uniformity.

Figure 6:
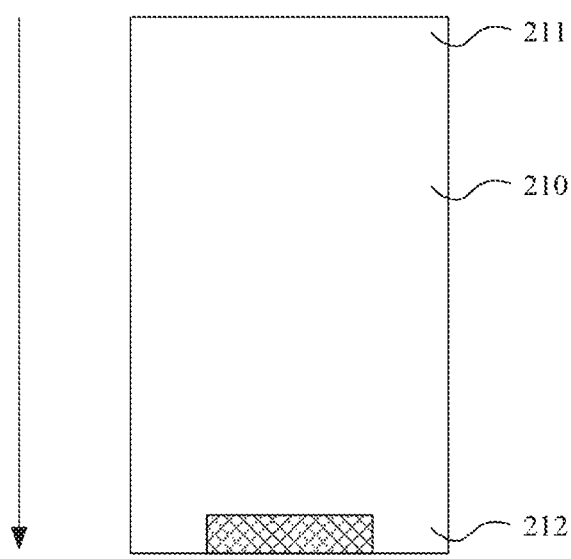

FIG. 6 shows a display panel which includes one display unit 210 in the second row of display units 200. The display unit 210 includes a first side 211 and a second side 212 which are opposite to each other, the second side 212 is an IC bonding side. An electrode overlap area of a storage capacitor Cst is gradually increased from the first side 211 to the second side 212 of the display unit 210, to compensate for luminance uniformity.

After a test, the first row of display units 100 and the second row of display units 200 have luminance uniformity of less than 65% When not employing the method for compensating a storage capacitor of the present disclosure. By employing the method for compensating a storage capacitor of the present disclosure, the current uniformity is greater than 85%, the luminance uniformity is greater than 76%, both of which are improved greatly, and the luminance uniformity of the third row of display units 300 and the fourth row of display units 400 rises from less than 80% to more than 80%.

Figure 7:
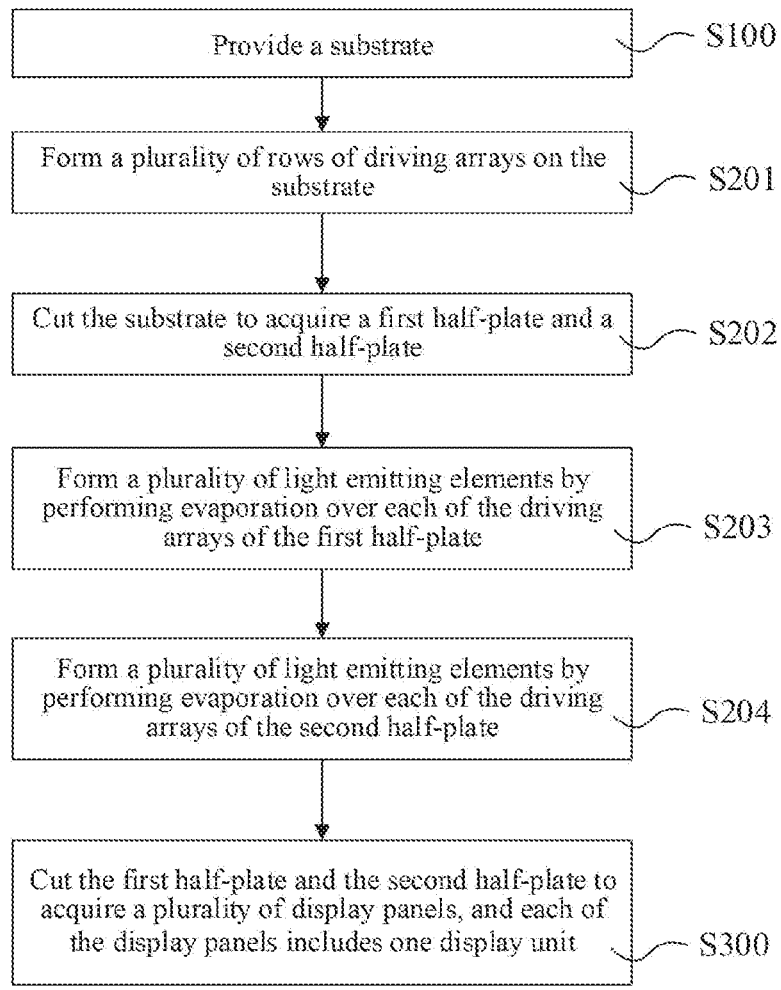
FIG. 7 is a flow chart of a method for fabricating a display panel according to an embodiment of the disclosure.

As shown in FIG. 7, an embodiment of the present disclosure further provides a method for fabricating a display panel, which includes the following steps, In step S100, a substrate is provided.

In step S200, a plurality of rows of display units is formed on the substrate to obtain a display motherboard, Wherein each of the display units includes a plurality of light emitting elements and storage capacitors which are in one-to-one correspondence, and each of the display units includes a first side and a second side which are opposite to each other, the second side of the display unit is an IC bonding side.

The display motherboard includes a first side edge and a second side edge opposite to each other, wherein a first row of display units is disposed at the first side edge of the display motherboard, and a second row of display units is disposed at the second side edge of the display motherboard.

A first side of the first row of display units corresponds to the first side edge of the display motherboard, and an electrode overlap area of a storage capacitor on the first side of the first row of display units is larger than an electrode overlap area of a storage capacitor on a second side thereof.

A second side of the second row of display units corresponds to the second side edge of the display motherboard, and an electrode overlap area of a storage capacitor on the second side of the second row of display units is larger than an electrode overlap area of a storage capacitor on a first side thereof;

In step S300, the display motherboard is cut to acquire a plurality of display panels, each of which includes one of the display units.

Further, the first side of the first row of display units corresponds to the first side edge of the display motherboard, and the electrode overlap area of the storage capacitor of the first row of display units is gradually increased from the second side to the first side of the first row of display units.

The second side of the second row of display units corresponds to the second side edge of the display motherboard, and the electrode overlap area of the storage capacitor of the second row of display units is gradually increased from the first side to the second side of the second row of display units.

In this embodiment, the step S200, in which a plurality of rows of display units is formed on the substrate to obtain a display motherboard, includes the following steps.

In step S201, a plurality of rows of driving arrays is formed on the substrate, wherein each of the driving arrays includes a plurality of pixel driving circuits, each of which includes a storage capacitor.

In step S202, the substrate is cut to acquire a first half-plate and a second half-plate.

In step S203, a plurality of light emitting elements is formed by performing evaporation over each of the driving arrays of the first half-plate, wherein each of the driving arrays and its corresponding light emitting element form a display unit.

In step S204, a plurality of light emitting elements is formed by performing evaporation over each of the driving arrays of the second half-plate, wherein each of the driving arrays and its corresponding light emitting element form a display unit.

The first half-plate includes a first row of display units disposed at the first side edge and a third row of display units disposed at the second side edge, wherein a second side of the third row of display units corresponds to the second side edge of the first half-plate, and an electrode overlap area of a storage capacitor of the third row of display units is gradually increased from a first side to the second side of the third row of display units.

The second half-plate includes a fourth row of display units disposed at the first side edge and a second row of display units disposed at the second side edge, wherein a first side of the fourth row of display units corresponds to the first side edge of the second half-plate; and an electrode overlap area of a storage capacitor of the fourth row of display units is gradually increased from a second side to the first side of the fourth row of display units.

In this embodiment, the first half-plate further includes a fifth row of display units between the first row of display units and the third row of display units;

the second half-plate further includes a sixth row of display units between the second row of display units and the fourth row of display units;

an electrode overlap area of each storage capacitor of the fifth row of display units is identical; and an electrode overlap area of each storage capacitor of the sixth row of display units is identical.

In this embodiment, an electrode overlap area of a storage capacitor on a first side of the first row of display units is 1%~10% larger than an electrode overlap area of a storage capacitor on a second side of the first row of display units;

an electrode overlap area of a storage capacitor on a second side of the second row of display units is 1%~10% larger than an electrode overlap area of a storage capacitor on a first side of the second row of display units;

an electrode overlap area of the storage capacitor on the second side of the third row of display units is 1%~10% larger than the electrode overlap area of the storage capacitor on the first side of the third row of display units;

an electrode overlap area of the storage capacitor on the first side of the fourth row of display units is 1%~10% larger than the electrode overlap area of the storage capacitor on the second side of the fourth row of display units.

In summary, compared to existing technologies, the display motherboard, the display panel, and the method for fabricating a display panel provided by the present disclosure perform gradual compensation for a storage capacitor with respect to uniform luminance at a low gray scale caused by unevenness in a manufacturing procedure and just a size of the storage capacitor according to a variation amount in the manufacturing procedure, to ensure that current flowing through each light emitting diode in the display panel is substantively the same, so as to improve luminance uniformity of the display panel at a low gray scale.

All other embodiments obtained by those skilled in the art based on the embodiments of the present disclosure without any creative efforts fall within the scope of the present disclosure. While the present disclosure has been illustratively shown and described based on the preferred embodiments, it will be understood by those skilled in the art that various changes and modifications of the present invention may be made without going beyond the scope defined by the claims of the present disclosure.

What is claimed is:

1. A display motherboard, comprising: a plurality of rows of display units, wherein each of the display units comprises a plurality of light emitting elements and pixel driving circuits in one-to-one correspondence with the light emitting elements, each of the pixel driving circuits comprises a storage capacitor, and each of the display units comprises a first side and a second side opposite to each other, and the second side of the display unit is an IC bonding side;

wherein the display motherboard comprises a first side edge and a second side edge opposite to each other, the first side edge of the display motherboard is provided with a first row of display units and the second side edge of the display motherboard is provided with a second row of display units;

an electrode overlap area of the storage capacitor of the first row of display units is gradually increased from a second side to a first side of the first row of display units;

an electrode overlap area of the storage capacitor of the second row of display units is gradually increased from a first side to a second side of the second row of display units, wherein the display motherboard comprises a first half-plate and a second half-plate, a size of the first half-plate and a size of the second half-plate correspond to a size of an evaporation device, respectively;

the first half-plate comprises a first side edge and a second side edge opposite to each other, wherein the first row of display units is disposed at the first side edge of the first half-plate, and a third row of display units is disposed at the second side edge of the first half-plate;

the second half-plate comprises a first side edge and a second side edge opposite to each other, wherein a fourth row of display units is disposed at the first side edge of the second half-plate, and the second row of display units is disposed at the second side edge of the second half-plate;

a second side of the third row of display units corresponds to the second side edge of the first half-plate, and an electrode overlap area of the storage capacitor of the third row of display units is gradually increased from a first side to the second side of the third row of display units; and a first side of the fourth row of display units corresponds to the first side edge of the second half-plate, and an electrode overlap area of the storage capacitor of the fourth row of display units is gradually increased from a second side to the first side of the fourth row of display units.

2. The display motherboard according to claim 1, wherein the first half-plate further comprises a fifth row of display units between the first row of display units and the third row of display units;

the second half-plate further comprises a sixth row of display units between the second row of display units and the fourth row of display units;

an electrode overlap area of each storage capacitor of the fifth row of display units is identical; and an electrode overlap area of each storage capacitor of the sixth row of display units is identical.

3. A display panel comprising a display unit according to claim 2.

4. The display motherboard according to claim 1, wherein the electrode overlap area of the storage capacitor on the first side of the first row of display units is 1%~10% larger than the electrode overlap area of the storage capacitor on the second side of the first row of display units; and the electrode overlap area of the storage capacitor on the second side of the second row of display units is 1%~10% larger than the electrode overlap area of the storage capacitor on the first side of the second row of display units.

5. A display panel comprising a display unit according to claim 4.

6. The display motherboard according to claim 1, wherein an electrode overlap area of the storage capacitor on the second side of the third row of display units is 1%~10% larger than an electrode overlap area of the storage capacitor on the first side of the third row of display units; and an electrode overlap area of the storage capacitor on the first side of the fourth row of display units is 1%~10% larger than an electrode overlap area of the storage capacitor on the second side of the fourth row of display units.

7. A display panel comprising a display unit according to claim 6.

8. A display panel comprising a display unit according to claim 1.

9. A display panel comprising a display unit according to claim 1.

10. A method for fabricating a display panel, comprising steps of:

providing (S100) a substrate;

forming (S200) a plurality of rows of display units on the substrate to obtain a display motherboard, wherein each of the display units comprises a plurality of light emitting elements and pixel driving circuits in one-to-one correspondence with the light emitting elements, each of the pixel driving circuits comprises a storage capacitor, and each of the display units comprises a first side and a second side opposite to each other, and the second side of the display unit is an IC bonding side, wherein the display motherboard comprises a first side edge and a second side edge opposite to each other, wherein a first row of display units is disposed at the first side edge of the display motherboard, and a second row of display units is disposed at the second side edge of the display motherboard;

a first side of the first row of display units corresponds to the first side edge of the display motherboard, and an electrode overlap area of the storage capacitor on the first side of the first row of display units is larger than an electrode overlap area of the storage capacitor on a second side of the first row of display units;

a second side of the second row of display units corresponds to the second side edge of the display motherboard, and an electrode overlap area of the storage capacitor on the second side of the second row of display units is larger than an electrode overlap area of the storage capacitor on a first side of the second row of display units;

cutting (S300) the display motherboard to acquire a plurality of display panels, wherein each of the display panels comprises one of the display units, wherein the electrode overlap area of the storage capacitor of the first row of display units is gradually increased from the second side to the first side of the first row of display units; and the electrode overlap area of the storage capacitor of the second row of display units is gradually increased from the first side to the second side of the second row of display units, wherein forming (S200) a plurality of rows of display units on the substrate to obtain a display motherboard comprises steps of:

forming (S201) a plurality of rows of driving arrays on the substrate, wherein each of the driving arrays comprises a plurality of pixel driving circuits, each of the pixel driving circuits comprises a storage capacitor;

cutting (S202) the substrate to acquire a first half-plate and a second half-plate;

forming (S203) a plurality of light emitting elements by performing evaporation over each of the driving arrays of the first half-plate, wherein each of the driving arrays and its corresponding light emitting element form a display unit;

forming (S204) a plurality of light emitting elements by performing evaporation over each of the driving arrays of the second half-plate, wherein each of the driving arrays and its corresponding light emitting element form a display unit;

wherein the first half-plate comprises a first row of display units disposed at the first side edge and a third row of display units disposed at the second side edge, wherein a second side of the third row of display units corresponds to the second side edge of the first half-plate, and an electrode overlap area of the storage capacitor of the third row of display units is gradually increased from a first side to the second side of the third row of display units;

the second half-plate comprises a fourth row of display units disposed at the first side edge and a second row of display units disposed at the second side edge, wherein a first side of the fourth row of display units corresponds to the first side edge of the second half-plate, and an electrode overlap area of the storage capacitor of the fourth row of display units is gradually increased from a second side to the first side of the fourth row of display units.

11. The method for fabricating a display panel according to claim 10, wherein the first half-plate further comprises a fifth row of display units between the first row of display units and the third row of display units; and the second half-plate further comprises a sixth row of display units between the second row of display units and the fourth row of display units;

an electrode overlap area of each storage capacitor of the fifth row of display units is identical; and an electrode overlap area of each storage capacitor of the sixth row of display units is identical.

* * * * *